United States Patent
Uchida

(10) Patent No.: US 8,340,149 B2
(45) Date of Patent: Dec. 25, 2012

(54) VERTICAL CAVITY SURFACE EMITTING LASER

(75) Inventor: Takeshi Uchida, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 12/817,514

(22) Filed: Jun. 17, 2010

(65) Prior Publication Data

US 2010/0322277 A1 Dec. 23, 2010

(30) Foreign Application Priority Data

Jun. 18, 2009 (JP) .................................. 2009-145550

(51) Int. Cl.
*H01S 5/00* (2006.01)
(52) U.S. Cl. ................................ 372/50.11; 372/50.124
(58) Field of Classification Search ............... 372/50.11, 372/50.124
See application file for complete search history.

(56) References Cited

U.S. PATENT DOCUMENTS

| | | | | |
|---|---|---|---|---|
| 5,963,576 A | * | 10/1999 | Claisse et al. | .................... 372/96 |
| 6,144,682 A | | 11/2000 | Sun | |
| 6,185,241 B1 | * | 2/2001 | Sun | .................. 372/96 |
| 2005/0063440 A1 | * | 3/2005 | Deppe | ............................. 372/50 |
| 2008/0205465 A1 | * | 8/2008 | Nguyen et al. | ............. 372/45.01 |

OTHER PUBLICATIONS

Chirovsky et. al., "Implant-Apertured and Index-Guided Vertical-Cavity Surface-Emitting Lasers", IEEE, PTL vol. 11, May 1999, pp. 500-502.

Wilmsen et al.,"Etched-Well VCSELs and Amorphous-Dielectric Mirrors" Vertical-Cavity Surface-Emitting Lasers: Design, Fabrication, Characterization, and Applications, 1999, pp. 309-313, Cambridge University Press, Cambridge UK.

Wilmsen et al., "Vertical-Cavity Surface-Emitting Lasers: Design, Fabrication, Characterization, Applications", Cambridge Studies in Modern Optics, 1999, pp. 170-171 and 274-275.

* cited by examiner

*Primary Examiner* — Yuanda Zhang
(74) *Attorney, Agent, or Firm* — Canon U.S.A., Inc. IP Division

(57) ABSTRACT

A vertical cavity surface emitting laser includes, a lower DBR layer; an upper DBR layer; an active layer existing between the lower DBR layer and the upper DBR layer; and a laser emitting region provided on a surface layer of the upper DBR layer, in which the upper DBR layer includes a doped first semiconductor multilayer film layer and an undoped second semiconductor multilayer film layer; an electrode provided on the upper DBR layer is formed in a region which is on an upper part of the first semiconductor multilayer film layer and is surrounded by the second semiconductor multilayer film layer; the laser emitting region is formed on a surface layer of the second semiconductor multilayer film layer; and the surface layer of the first semiconductor multilayer film layer is formed by a contact layer and the second semiconductor multilayer film layer is stacked on the contact layer.

5 Claims, 3 Drawing Sheets

(PRIOR ART)

VERTICAL CAVITY SURFACE EMITTING LASER

BACKGROUND OF THE INVENTION

1. Field of the Invention

The present invention relates to a vertical cavity surface emitting laser.

2. Description of the Related Art

A Vertical Cavity Surface Emitting Laser (VCSEL), which emits a laser beam in a direction vertical to a substrate, has advantages of such as being easily two-dimensionally arrayed into high density.

By using the VCSEL array in which these vertical resonator type lasers are accumulated in high density, an electrophotography can form an image of a higher definition with a higher speed.

One problem of the VCSEL is a transverse mode control, and U.S. Pat. No. 6,144,682 proposes a structure (surface relief) in which a shallow relief is formed on the top surface of a Distributed Bragg Reflector (DBR) and thereby forms a distribution of reflectance in the plane.

FIG. 6 illustrates an outline of the structure disclosed in U.S. Pat. No. 6,144,682.

In FIG. 6, a semiconductor DBR 1302 is stacked on a substrate 1301, and a resonator 1304 containing a plurality of quantum wells 1313, and a semiconductor DBR 1303 are formed thereon. A selectively oxidizable layer 1316 having a high Al composition is formed in this semiconductor DBR 1303.

An oxidized part 1317 for confining an electric current and an unoxidized part 1318 are formed by oxidizing the selectively oxidizable layer 1316 from a side wall of mesa structure.

A contact layer 1320 for electrically contacting an upper electrode 1321 is formed on the top layer of the semiconductor DBR 1303.

A lower electrode 1322 is provided on the rear surface of the substrate 1301.

A region 1323 is formed by etching one part of the contact layer 1320. Due to this etching, the reflectance of the circular region 1323 which has been etched becomes higher than that of an unetched part.

Thereby, the reflectance in the central part of the surface emitting laser becomes higher than that in the peripheral part. As a result, the oscillation of a high-order transverse mode can be reduced.

In addition, Chirovsky et al., IEEE, PTL Vol. 11, 1999, pp 500 proposes an intracavity type surface emitting laser which has a dielectric DBR stacked on a semiconductor DBR and injects an electric current from the semiconductor DBR.

SUMMARY OF THE INVENTION

In the structure of the above described U.S. Pat. No. 6,144,682, an electric current is injected into the semiconductor DBR 1303 through the contact layer 1320 from the upper electrode 1321.

Generally, the contact layer 1320 is doped with a high concentration of dopant for adequately and electrically contacting with an electrode metal, and employs a semiconductor having large hole mobility in many cases. Accordingly, the contact layer has higher electrical conductivity than a semiconductor layer constituting the semiconductor DBR 1303 underneath.

Therefore, the electric current which has flowed from the electrode metal flows in the contact layer having high electroconductivity in a transverse direction, and then flows so as to diffuse into a semiconductor DBR 1303 side.

On the other hand, a degraded mode due to a so-called rising motion (<100>DLD) or <110>DLD from the surface of a semiconductor crystal generally exists in a semiconductor laser.

The degraded mode is caused by the dislocation which occurs while initiating from the surface of the semiconductor crystal and extends to the inner side of the semiconductor therefrom.

The growth speed of the dislocation is accelerated by the electric current.

For this reason, when the contact layer on the top surface of the VCSEL is damaged, the dislocation occurs while initiating from the damaged point and thereby causes the degradation.

Then, because a high density of the electric current flows in the contact layer as described above, the growth of the dislocation is largely accelerated by the electric current, and thereby a failure results in occurring in the device.

Furthermore, in the case of the structure as illustrated in FIG. 6, the electric current is further concentrated at a part at which the edge of the contact layer 1320 comes in contact with the semiconductor DBR 1303.

The surface and the side face of the semiconductor are also damaged by etching for forming the region 1323.

For this reason, in the case of the structure as illustrated in FIG. 6, the dislocation occurs on the surface of the contact layer 1320, and results in growing further rapidly due to a higher density of the electric current. For this reason, the device causes rapid degradation therein and decreases its reliability.

In addition, when the dielectric DBR is stacked on the semiconductor DBR as in Chirovsky et al., IEEE, PTL Vol. 11, 1999, pp 500, the dislocation may occur on the interface between a semiconductor and a dielectric, because the semiconductor crystal terminates on the interface between the semiconductor and the dielectric, and an electric current flows in the top semiconductor surface layer.

In addition, when the dielectric is stacked after the semiconductor has been processed, an optical error factor increases and it is hard to strictly control the film thickness and to stabilize device characteristics.

The present invention has been designed with respect to the above described problem, and is directed at providing a highly-reliable vertical cavity surface emitting laser in which a region in which an electric current exists in an upper DBR layer provided with a laser emitting region is separated from the surface of the semiconductor, and the growth of the dislocation, which has initiated from the surface of the semiconductor, due to acceleration by the electric current, is reduced.

The present invention provides a vertical cavity surface emitting laser having the following structure.

The vertical cavity surface emitting laser includes a lower DBR layer, an upper DBR layer, an active layer existing between the lower DBR layer and the upper DBR layer; and a laser emitting region provided on a surface layer of the upper DBR layer, in which the upper DBR layer includes a doped first semiconductor multilayer film layer and an undoped second semiconductor multilayer film layer, an electrode provided on the upper DBR layer is formed in a region which is on an upper part of the first semiconductor multilayer film layer and is surrounded by the second semiconductor multilayer film layer, the laser emitting region is formed on a surface layer of the second semiconductor multilayer film layer, and the surface layer of the first semiconductor multilayer film layer is formed by a contact layer and the second semiconductor multilayer film layer is stacked on the contact layer.

The present invention can achieve a highly-reliable vertical cavity surface emitting laser in which a region in which an electric current exists in an upper DBR layer provided with a laser emitting region is separated from the surface of the semiconductor, and the growth of the dislocation, which has initiated from the surface of the semiconductor, due to acceleration by the electric current, is reduced.

Further features of the present invention will become apparent from the following description of exemplary embodiments with reference to the attached drawings.

DESCRIPTION OF THE EMBODIMENTS

Figure 1:
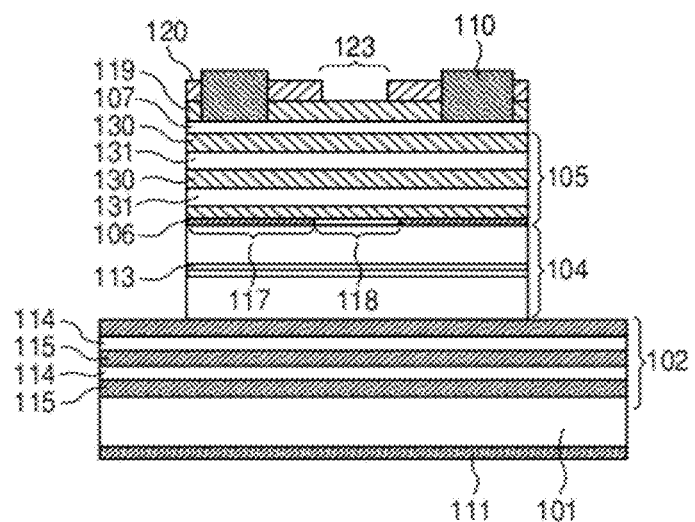
FIG. 1 is a sectional schematic view for describing a structure of a red surface emitting laser of the embodiment and Example 1 according to the present invention.

Preferred embodiments of the present invention will now be described in detail in accordance with the accompanying drawings.

Examples of a structure of the vertical cavity surface emitting laser according to the present invention will be described below.

The surface emitting laser according to the embodiment of the present invention includes at least a lower DBR layer, an upper DBR layer and an active layer existing between the above layers, which are stacked on a substrate, and has a laser emitting region which emits a laser beam to the outside formed on the surface layer of the upper DBR layer.

The upper DBR layer has a structure including a doped first semiconductor multilayer film layer (first semiconductor DBR) and an undoped second semiconductor multilayer film layer (second semiconductor DBR).

The upper electrode is formed in a region which is the upper part of the first semiconductor DBR and is surrounded by the second semiconductor DBR.

Because the first semiconductor DBR, the second semiconductor DBR and the electrode are structured as described above, a region in which an electric current density is high overlaps little with the surface of the semiconductor, from which dislocation may initiate.

As a result, even if a damage from which the dislocation initiates exists on the surface of the semiconductor, such an electric current as to accelerate the growth of the dislocation does not exist in the surface, thereby the degradation of the device can be reduced.

When the dielectric DBR is stacked on the semiconductor DBR as described in the above Chirovsky et al., IEEE, PTL Vol. 11, 1999, pp 500, the dislocation may occur on the interface between the semiconductor and the dielectric.

In addition, when the dielectric is stacked after the semiconductor has been processed, an optical error factor increases and it is hard to strictly control the film thickness and to stabilize device characteristics.

For this reason, the surface emitting laser according to the present invention has a structure in which a first semiconductor DBR and a second semiconductor DBR which constitute an upper DBR are formed of a continuous semiconductor single crystal.

In a VCSEL oscillating at a wavelength shorter than 850 nm, in which a ternary mixed crystal made from AlGaAs is required to use for its DBR, GaAs is used for the contact layer, in which the GaAs is doped with a higher concentration of dopant than that of other semiconductor layers except its contact layer.

Because the electrical conductivity of the GaAs layer is particularly larger than that of the AlGaAs layer under the GaAs layer, most of the electric current flowing in the DBR in a transverse direction flows in the contact layer. As a result, a higher density of an electric current exists in the surface layer of the semiconductor, which promotes the growth of the dislocation in the crystal, and causes the degradation of the device.

Accordingly, the structure according to the present embodiment can be suitably employed for the VCSEL which oscillates at a wavelength shorter than 850 nm.

FIG. 1 is a view illustrating a layer structure according to the present embodiment.

In the present embodiment, as is illustrated in FIG. 1, an n-DBR 102 is stacked on a GaAs substrate 101, which includes an AlAs layer 114 having an optical thickness of ¼ of the wavelength and an AlGaAs layer 115.

On the n-DBR 102, a resonator 104 is formed, which uses AlGaInP, has an optical thickness equal to one wavelength, and includes a plurality of quantum wells 113 with the use of GaInP.

On the resonator 104, there is an upper DBR 105 (first semiconductor DBR) which includes an $Al_{0.9}GaAs$ layer 130 having an optical thickness of ¼ of the wavelength and an $Al_{0.5}GaAs$ layer 131.

Here, the upper DBR 105 has an $Al_{0.9}GaAs$ layer 130 and an $Al_{0.5}GaAs$ layer 131, which are p-type-doped, and a GaAs contact layer 107 which is highly doped.

Furthermore, an undoped AlGaInP layer 119 and an undoped GaAs layer 120 which are formed from an insulative semiconductor having low electrical conductivity are formed on the contact layer 107.

These undoped AlGaInP layer 119 and undoped GaAs layer 120 function as a DBR, and correspond to the above described second semiconductor DBR.

On the side of the undoped AlGaInP layer 119 and the undoped GaAs layer 120, an electrode 110 for electrical contact is arranged and the electric current having flowed out from the electrode flows in the contact layer 107 in a transverse direction.

The contact layer 107 is sandwiched between the undoped AlGaInP layer 119 and the DBR 105, and accordingly is not exposed to the outside of the surface of the semiconductor.

For this reason, a region in which an electric current concentrates is separated from the surface of the semiconductor, and even when the dislocation has occurred on the surface of the semiconductor, the acceleration of the growth by the electric current is prevented. As a result, the degradation of the device can be prevented.

EXAMPLES

Examples of the present invention will be described below.

Example 1

The structure of a red surface emitting laser in a vertical cavity surface emitting laser according to Example 1 of the present invention will be described below with reference to FIG. 1.

As is illustrated in FIG. 1, a DBR 102 including an n-type AlAs layer 114 and an $Al_{0.5}Ga_{0.5}As$ layer 115 is arranged on the upper part of a GaAs substrate 101.

A resonator 104 which includes four $Ga_{0.45}In_{0.55}P$ quantum wells and AlGaInP layers 113 that sandwich the quantum wells and has an optical thickness equal to one wavelength is positioned on the DBR 102.

A DBR 105 including 30 pairs of p-type $Al_{0.9}Ga_{0.1}As$ layers 130 and $Al_{0.5}Ga_{0.5}As$ layers 131 is positioned on the resonator 104.

An $Al_{0.98}Ga_{0.02}As$ oxidizable layer 106 having the thickness of 30 nm is inserted between the active layer of the DBR 105 and the first layer therefrom of the $Al_{0.5}Ga_{0.5}As$ layer.

The oxidizable layer 106 is divided into a part 117 which has been oxidized by water vapor and a non-oxidized part 118 which has not been oxidized and has the diameter of 6 μm.

A contact layer 107 which has the thickness of 10 nm and is formed of a highly-doped p-type GaAs is positioned on the DBR 105.

There is an upper electrode 110 which reliably comes in electric contact with the contact layer 107 on the upper part of the contact layer 107.

There is a lower electrode 111 on the rear surface of the substrate, which reliably comes in electric contact with the substrate 101, under the substrate 101.

Furthermore, there are an undoped AlGaInP layer 119 having the optical thickness of a half of the oscillation wavelength, and an undoped GaAs layer 120 having the optical thickness of ¼ of the oscillation wavelength on the contact layer 107. A part 123 is formed in the undoped GaAs layer 120, in which the GaAs layer 120 has been removed in a region that has the same center axis as that of the non-oxidized part 118 and has the diameter of 4 μm.

Figure 6:
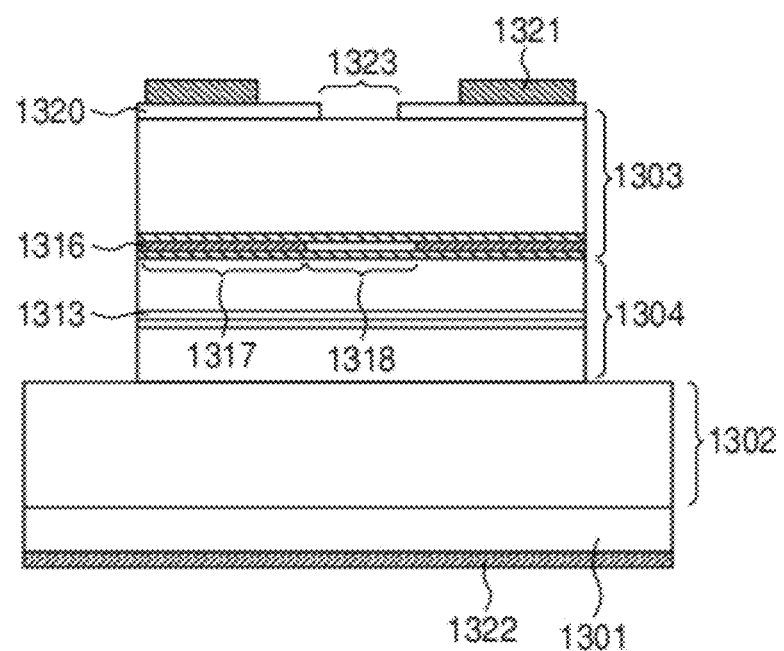
FIG. 6 is a sectional schematic view for describing a structure of a vertical cavity surface emitting laser in the specification of U.S. Pat. No. 6,144,682, which is the conventional example.

Next, a model for computing the electric current distribution in the vicinity of the surface of the upper DBR and the computation result will be described with reference to FIGS. 2A and 2B and FIGS. 3A and 3B, where the structure in Example 1 and a conventional case in which the contact layer on the top surface has been processed (FIG. 6) are compared.

Figure 2A:
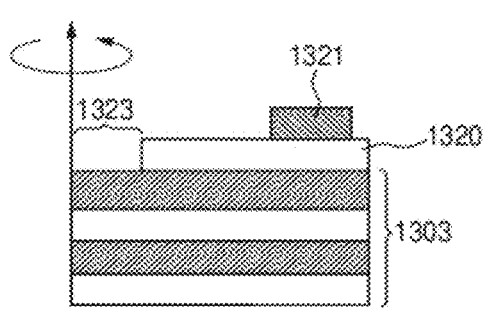
FIG. 2A is a view for describing a model for computing an electric current distribution in the vicinity of the surface of the upper DBR in the structure of FIG. 6, which is a conventional example.
Figure 3A:
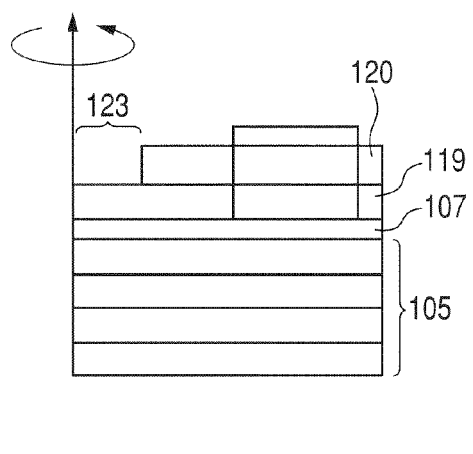
FIG. 3A is a view for describing a model for computing an electric current distribution in the vicinity of the surface of the upper DBR in a structure according to Example 1 of the present invention.

FIG. 2A illustrates the case of a structure in which a GaAs contact layer 1320 is arranged on the top surface of a semiconductor DBR 1303 and the central part has been etched as described in U.S. Pat. No. 6,144,682 specification, and FIG. 3A illustrates the case of a structure of Example 1.

Figure 2B:
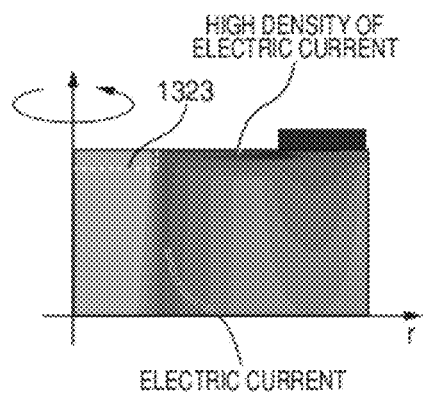
FIG. 2B is a view for describing a computed result of the electric current distribution in the vicinity of the surface of the upper DBR in the structure of FIG. 6, which is the conventional example.

As is illustrated in FIG. 2B, it is understood that in the structure of a conventional example, a high density of an electric current flows in the GaAs contact layer 1320 of the top surface in a transverse direction, and an electric current that has reached the part 1323 which has been removed by etching flows in the side face of the hole.

For this reason, when the surface of the contact layer 1320 or the etched side face is damaged, the growth of the dislocation is accelerated by the high density of the electric current flowing in the contact layer 1320.

Figure 3B:
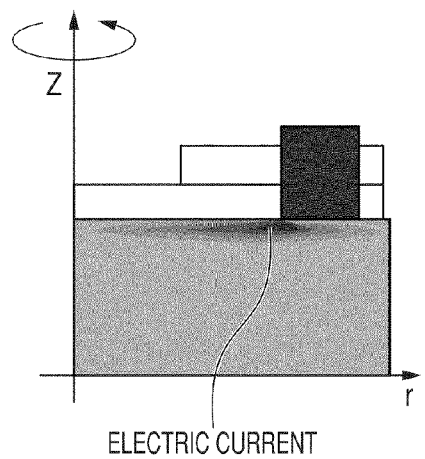
FIG. 3B is a view for describing a result of having computed the electric current distribution in the vicinity of the surface of the upper DBR in the structure according to Example 1 of the present invention.

According to the result of having computed the electric current distribution in the present example illustrated in FIG. 3B, it is understood that the electric current does not flow in the semiconductor on the surface because the semiconductor of the upper layers than the contact layer 107 is not doped, but flows in the contact layer 107 of the inner part in a transverse direction, in the present example.

Therefore, even when the surface of the semiconductor, specifically, the GaAs layer 120 or the AlGaInP layer 119 is damaged, the growth of the dislocation is not accelerated by the electric current because the electric current does not exist in this part, and the growth of the dislocation can be made to be greatly retarded, which can improve the reliability of the VCSEL.

Next, a procedure of preparing the device in the present example will be described below.

Firstly, the structure of the semiconductor layers of the above described DBR 102, resonator 104, DBR 105, high-doped p-type GaAs layer 107, AlGaInP 119 and GaAs layer 120 are grown by metal organic chemical vapor deposition or molecular beam epitaxy.

A dielectric film is formed on the wafer by using sputtering. After this, a ring-shaped pattern is formed with a photoresist by using photolithography.

The dielectric film in a part having no photoresist thereon and the undoped GaAs layer 120 on the top surface having no photoresist thereon are removed.

Then, a dielectric film is formed again by using sputtering. Sputtering is preferably used in this procedure so as to keep the side face of the resist not being covered with the dielectric film.

Then, a mask is formed so as to cover the central part of the ring by using a different type of photoresist.

After this, the layers are dug down to an active layer part 104 by dry etching so that a selectively oxidizable layer 106 can be exposed, while the ring-shaped resist is used as a mask that the peripheral part determines a mesa portion.

Then, an $Al_{0.98}Ga_{0.02}As$ selectively oxidizable layer 106 is oxidized from a transverse direction in a water vapor atmosphere at approximately 450° C. At this time, an oxidized part 117 for confining an electric current and light, and a non-oxidized part 118, are produced by controlling the oxidation period of time.

The oxidation period of time is controlled so that the diameter of the non-oxidized part 118 can be approximately 6 micrometers.

After this, the resist is stripped, and a dielectric film for passivation is formed over the whole wafer with the use of plasma CVD method.

A resist pattern which has a ring-shaped hole for exposing the contact layer 107 is formed on the dielectric film. Then a part in which the contact layer 107 is exposed in a ring shape by removing the dielectric film, the undoped GaAs layer 120 and the undoped AlGaInP layer 118 with the use of the resist pattern.

A p-side electrode 110 and an n-side electrode 111 are formed by using a vacuum vapor deposition method and a photolithographic method.

A circular window for extracting laser light therefrom is formed in the p-side electrode 110. The electrode and the semiconductor are alloyed in a high temperature nitrogen atmosphere so that adequate electrical properties can be obtained. Thus, the device is completed.

Example 2

Figure 4:
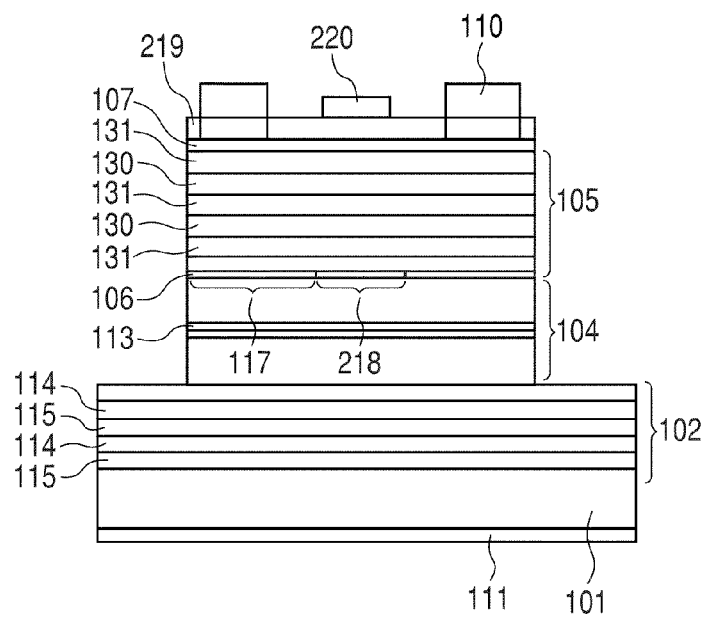
FIG. 4 is a sectional schematic view for describing a structure of a red surface emitting laser according to Example 2 of the present invention.

The structure of the red surface emitting laser according to Example 2 will be described below with reference to FIG. 4.

In the present example, a member formed of the same member as in Example 1 is designated by the same reference character.

Specifically, the layer structure from the electrode 111 on the rear surface of the GaAs substrate 101 to the contact layer 107 and the p-side electrode 110 are the same members as those in Example 1. The difference between the present example and Example 1 is in a structure of the second DBR positioned in the upper part of the contact layer 107, and specifically, is in the shape of the top layer and the optical thickness of the layer positioned thereunder.

In the top layer in Example 1, in other words, the undoped GaAs layer 120, the central part thereof is etched, whereas the top layer of the undoped GaAs layer in Example 2 is etched so as to form a ring shape, and a cylindrical central part 220 having the same center axis as that of the non-oxidized part 218 is formed.

The etching pattern of the top surface layer is contrastive, but the optical reflectance as DBR is both designed in the following way.

Specifically, the central part (the etched part 123 in Example 1 and the cylindrical top layer 220 in the present example) is designed so as to have a higher reflectance than that of its periphery, for the purpose of transverse mode control.

For this reason, each second layer from the top of the present example and Example 1 (the undoped AlGaInP layer 119 in Example 1 and an undoped AlGaInP layer 219 in the present example) has a different optical thickness from each other.

In Example 1, the AlGaInP layer 119 has the optical thickness of a half of the oscillation wavelength, but in the present example, the AlGaInP layer 219 is determined so as to have the optical thickness of ¼ of the oscillation wavelength.

In the present example as well, layers in the upper part of the contact layer 107 are undoped, and the electric current does not flow in the top surface layers (the AlGaInP layer 219 and the GaAs layer 220).

Therefore, even if a damage from which the dislocation initiates is formed on the surface of the semiconductor by etching or other factors, the growth is not accelerated by the electric current.

As a result, the degradation of the device due to the acceleration can be prevented, and the decrease in the reliability of the device can be prevented.

Example 3

In Example 3, a structure example different from that in the above described Examples 1 and 2 will be described with reference to FIG. 5.

In the above described Example 1, a laser emitting region which has been formed in the central part in the in-plane direction of the surface layer of the second semiconductor multilayer film layer is formed in a circle by etching.

In the above described Example 2, the laser emitting region is formed in a ring shape by etching, in which the central part is left. However, in a case when there is no need to control a transverse mode, this process is not necessarily be carried out.

Figure 5:
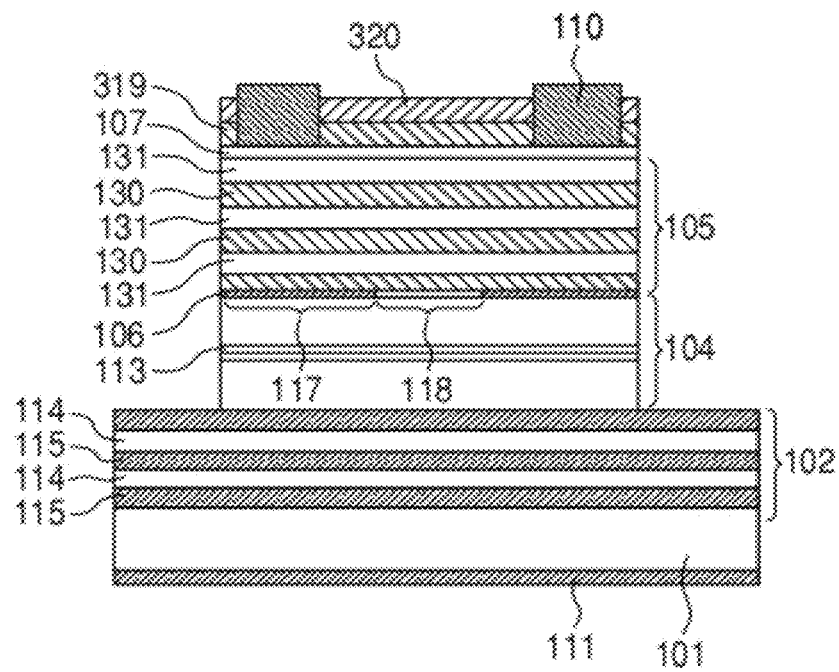
FIG. 5 is a sectional schematic view for describing a structure of a red surface emitting laser according to Example 3 of the present invention.

For instance, as is illustrated in FIG. 5, the contact layer 107 is arranged in the upper part of the first electroconductive DBR 105. Subsequently, an AlGaInP layer 319 and a GaAs layer 320 are arranged on the upper part as an undoped DBR. Eventually, in the structure, the surface of the device is not processed, which is different from that in Example 1 and Example 2.

The same members as those in Example 1 out of members in FIG. 5 were designated by the same reference characters.

In the present example, the surface of the top layer of the DBR is not subjected to intentional processing. Accordingly, a damage due to the processing does not occur.

However, if an unintentional small damage was formed in the processing, a failure starting from the damage occurs, which lowers the reliability.

In contrast, in the structure of the present example, even if the unintentional small damage was formed in the processing, the dislocation is not greatly accelerated by an electric current, because the electric current does not flow in any of the GaAs layer 320 of the surface and the AlGaInP layer 319 thereunder.

As a result, the failure resulting from the damage can be reduced, and the reliability can be enhanced.

In addition, a plurality of vertical cavity surface emitting lasers in Example 1, Example 2 and the present example may be arranged on the same substrate to form a laser array.

Furthermore, a vertical cavity surface emitting laser array having one or a plurality of vertical cavity surface emitting lasers illustrated in Examples 1 to 3 arranged on a single substrate may be used in a laser beam printer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-145550, filed on Jun. 18, 2009, which is hereby incorporated by reference herein in its entirety.

What is claimed is:

1. A vertical cavity surface emitting laser, comprising:
a lower DBR layer;
an upper DBR layer;
an active layer existing between the lower DBR layer and the upper DBR layer; and
a laser emitting region provided on a surface layer of the upper DBR layer, wherein:
the upper DBR layer includes a doped first semiconductor multilayer film layer and an undoped second semiconductor multilayer film layer;
an electrode provided on the upper DBR layer is formed in a region which is on an upper part of the first semiconductor multilayer film layer and is surrounded by the second semiconductor multilayer film layer;
the laser emitting region is formed on a surface layer of the second semiconductor multilayer film layer;
a surface layer of the first semiconductor multilayer film layer comprises a contact layer;
the second semiconductor multilayer film layer is stacked on the contact layer; and wherein a continuous semiconductor single crystal having a lattice matched structure contains the first semiconductor multilayer film layer and the second semiconductor multilayer film layer.

2. The vertical cavity surface emitting laser according to claim 1, wherein the first semiconductor multilayer film layer and the second semiconductor multilayer film layer are formed in which a crystal lattice of the continuous semiconductor single crystal is continued from the first semiconductor multilayer film layer to the second semiconductor multilayer film layer.

3. The vertical cavity surface emitting laser according to claim 1, wherein the contact layer is doped with a higher concentration of dopant than that of the other semiconductor multilayer film layers.

4. The vertical cavity surface emitting laser according to claim 1, wherein the surface layer of the second semiconductor multilayer film layer has a laser emitting region in the central part in an in-plane direction of the surface layer, and the central part of the laser emitting region is formed by etching.

5. The vertical cavity surface emitting laser according to claim 1, wherein the surface layer of the second semiconductor multilayer film layer has a laser emitting region in the central part in an in-plane direction of the surface layer, and the laser emitting region is formed in a ring shape by etching, in which the central part is not removed.

* * * * *